United States Patent [19]

Sondermeyer et al.

[11] Patent Number: 5,647,004

[45] Date of Patent: Jul. 8, 1997

[54] MULTI-STAGE SOLID STATE AMPLIFIER THAT EMULATES TUBE DISTORTION

[75] Inventors: Jack C. Sondermeyer; James W. Brown, Sr., both of Meridian, Miss.

[73] Assignee: Peavey Electronics Corporation, Meridian, Miss.

[21] Appl. No.: 179,546

[22] Filed: Jan. 10, 1994

[51] Int. Cl.$^6$ .................................... H03G 3/00
[52] U.S. Cl. .................................... 381/61; 381/62
[58] Field of Search .................... 381/61, 62–65

[56] References Cited

U.S. PATENT DOCUMENTS

| | | | |
|---|---|---|---|
| 4,405,832 | 9/1983 | Sondermeyer | 179/1 D |
| 4,495,640 | 1/1985 | Frey | 381/61 |
| 4,584,700 | 4/1986 | Scholz | 381/61 |
| 4,627,094 | 12/1986 | Scholz | 381/61 |
| 4,809,336 | 2/1989 | Pritchard | 381/61 |
| 4,811,401 | 3/1989 | Brown, Sr. et al. | 381/61 |
| 4,995,084 | 2/1991 | Pritchard | 379/94 |
| 5,032,796 | 7/1991 | Tiers et al. | 330/110 |
| 5,131,044 | 7/1992 | Brown, Sr. et al. | 381/61 |
| 5,133,014 | 7/1992 | Pritchard | 381/61 |

Primary Examiner—Stephen Brinich
Attorney, Agent, or Firm—Watson Cole Stevens Davis, P.L.L.C.

[57] ABSTRACT

A multi-stage solid state amplifier emulates the distortion associated with grid current flow in a multi-stage tube amplifier by means of a clipping device in the circuit between each series connected stage. In a particular embodiment, each stage includes a field effect transistor (FET) and the clipping device is a diode.

16 Claims, 3 Drawing Sheets

MULTI-STAGE SOLID STATE AMPLIFIER THAT EMULATES TUBE DISTORTION

BACKGROUND OF THE INVENTION

The invention pertains to amplifiers for musical instruments. In particular, the invention pertains to a solid state multi-stage amplifier which has distortion so that it sounds like a tube amplifier when overdriven.

Tube amplifiers are often preferred by musical artists because tubes produce a distorted output sound which is familiar and thought to be most pleasing. Solid state amplifiers are often preferred because they tend to be lighter, and are often less expensive to produce, are more durable and consume less power. It is difficult to make a solid state amplifier produce a distorted sound like a tube amplifier. Also, the supply of tubes available for use in amplifiers has become scarce and more expensive.

A known tube amplifier 10 is shown in FIG. 1. The amplifier is described with exemplary values of the various elements being noted for characterizing the operation of the device. The amplifier 10 illustrated in FIG. 1 is a pre-amplifier comprising four identical tube sections 12, 14, 16 and 18 (e.g., two 12AX7 tubes), each tube has a corresponding plate resistor 20 (100 K ohm) and a cathode resistor 22 (1.5 K ohm). Each cathode resistor 22 is bypassed with a capacitor 24 (2.2 uF). With these plate and cathode resistor values, a typical 12AX7 amplifier tube will idle at approximately 1 mA of plate current, approximately 1.5 volts at the cathode and about +200 volts at the plate from a +300 volt source. A positive grid swing in excess of 1.5 volts peak will cause the grid to conduct. A normal guitar input is coupled to the grid of the first tube stage 12 by a coupling capacitor 34 and a grid resistor 36. A resistor 38 is coupled to the node between the capacitor 34 and grid resistor 38 and provides a ground reference for the input to tube 12. Feedback capacitor 40 (10 PF) is coupled between the plate and grid of tube 12 and provides some control of high frequency roll-off, known as the Miller effect, which helps to keep the amplifier stable at open input conditions. The signal from the plate of amplifier 12 is coupled to input of amplifier stage 14 via capacitor 42 and grid resistor 44. Resistor 46 provides a ground reference for stage 14. Resistors 44 and 46 act as a voltage divider. The signal from stage 14 is likewise coupled to stage 16 via capacitor 48 and grid resistor 50, with resistor 52 providing a ground reference for the input and voltage division. Finally, the signal from stage 16 is coupled to the stage 18 via capacitor 54, grid resistor 56 and reference resistor 58 to ground also with voltage division. The output of stage 18 is coupled to the output of the pre-amplifier 10 by output capacitor 60.

The coupling capacitor values 42, 48 and 54, as well as the values of the divider resistances 44/46, 50/52 and 56/58 are chosen in a known manner to provide good distorted sound. Typically, with a guitar level input signal applied, the first stage 12 is clean and free of distortion, although with some high level guitars, even this stage clips at times. The first stage output signal level is high enough to cause input clipping at the second stage 14 because the grid of the second stage 14 is driven positive with respect to the cathode and conducts for a substantial portion of the input cycle. Input clipping at stage 14 results in an average negative voltage on the grid, causing the operating point of the second stage 14 to shift dramatically resulting in a significant amount of second harmonic distortion. The signal at the plate of the second stage 14 resembles a square wave with about two-thirds of the period spent in the positive half cycle. The plate of the second stage 14 has a high enough signal level to cause significant input clipping at the third stage 16. Here too, the grid swings positive with respect to the cathode. Thus, input clipping causes the operating point of the third stage 16 to shift. This is repeated yet one more time, resulting in input clipping and operating point shift of the fourth stage 18. The output at the plate of the fourth stage 18 has gone through several different levels of clipping at the input and output and several operating point shifts and is thus rich in harmonics. All of this essentially results in a characteristic sound which is referred to as good tube sound.

In the exemplary pre-amplifier 10 illustrated in FIG. 1, the available peak plate swing in the positive direction for any stage is about 100 volts (i.e., about one-half the plate voltage). Further, each grid conducts at a positive peak swing of about 1.5 volts. The ratio of 100 to 1.5 or 66.7 is a high number, and its value is important to shift the operating point of each stage enough to generate the appropriate amount of second harmonic distortion. The values of divider resistors 44/46, 50/52 and 56/58 are also critical, and are carefully chosen to set just the right amount of input clipping and resulting second harmonic distortion to produce a pleasing sound.

Of note here are two key ingredients in the so called distorted tube sound. First, the tube characteristics themselves with the 100 volt output capability and only a 1.5 volt input clipping capability or level is unique and required for successful generation of the second harmonic distortion, and that so called tube sound. Secondly, the multiplicity of stages is necessary four a sustained distortion sound as the guitar output level drops after being plucked by the musician. Although more or fewer stages may be employed, at least three, and preferably four stages are required to achieve the desired distortion sound sought by most musicians.

There is, therefore, a need for a solid state amplifier which is capable of replacing the various tube stages in a multi-stage pre-amplifier, and which may be overdriven to emulate the tube sound produced by the such known tube amplifiers.

SUMMARY OF THE INVENTION

The invention is based upon the discovery that the distortion associated with the flow of current in the grid of a tube amplifier operated at high input levels is duplicated in a multi-stage solid stage amplifier by means of a clipping device in the coupling circuit between stages.

The invention comprises a multistage solid state amplifier for emulating the distortion associated with a tube pre-amplifier when overdriven. The invention includes a plurality of solid state tandem or series connected amplifier stages having an input circuit and an output circuit. Each downstream stage has its input circuit coupled to the output circuit of an upstream stage. A clipping device such as a diode is coupled in the input circuit between the stages.

In a particular embodiment, each solid state amplifier stage includes a field effect transistor (FET) having its output terminal coupled to the input of the next downstream stage and the diode is located in the input circuit so as to duplicate the desirable input clipping characteristics of a tube amplifier, wherein the ratio of the output capability to the input clipping level between stages is sufficient to result in adequate second harmonic distortion.

DESCRIPTION OF THE INVENTION

Figure 1:
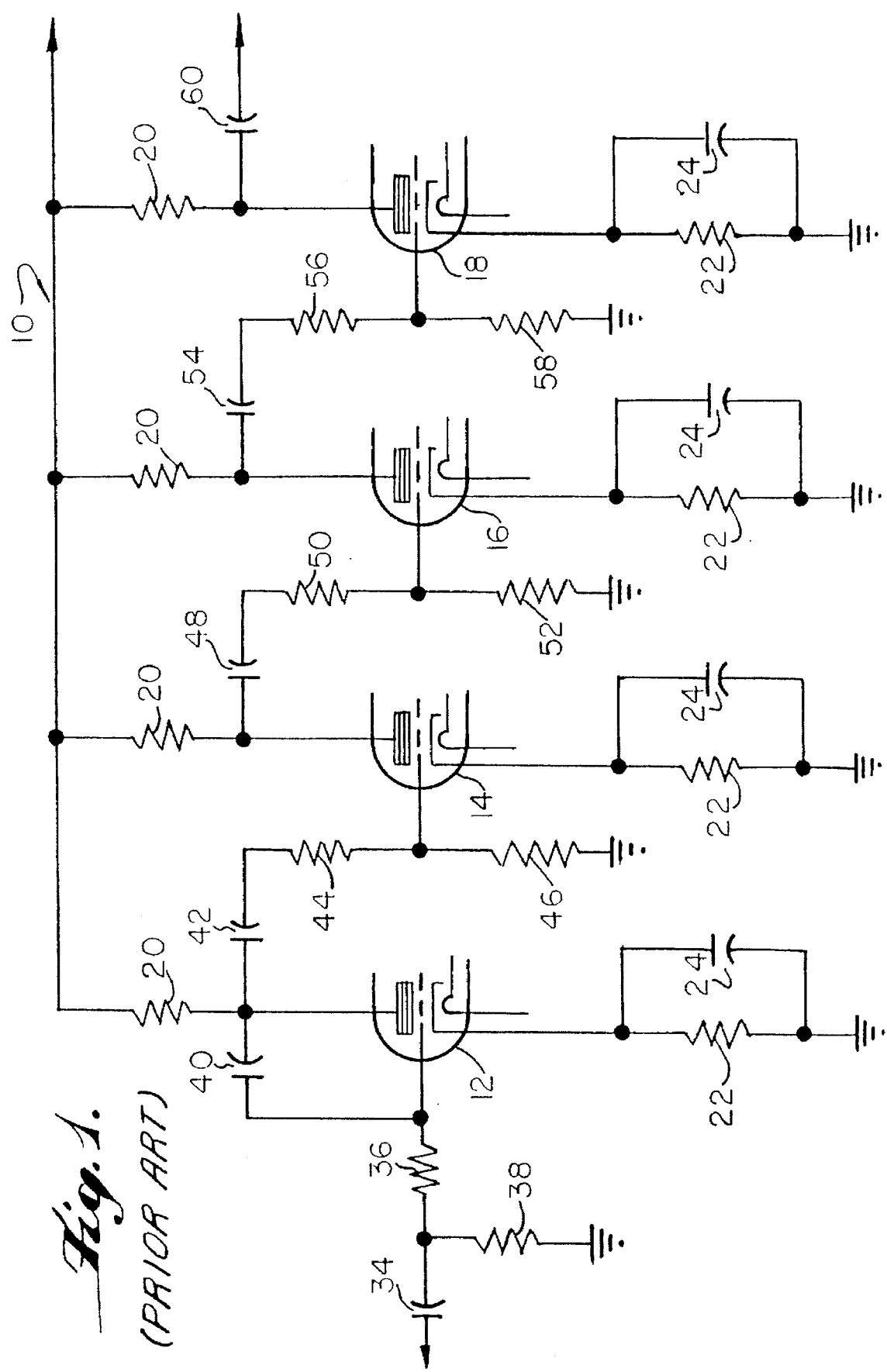
FIG. 1 is a schematic illustration of a known vacuum tube amplifier which exhibits a desirable distorted output.
Figure 2:
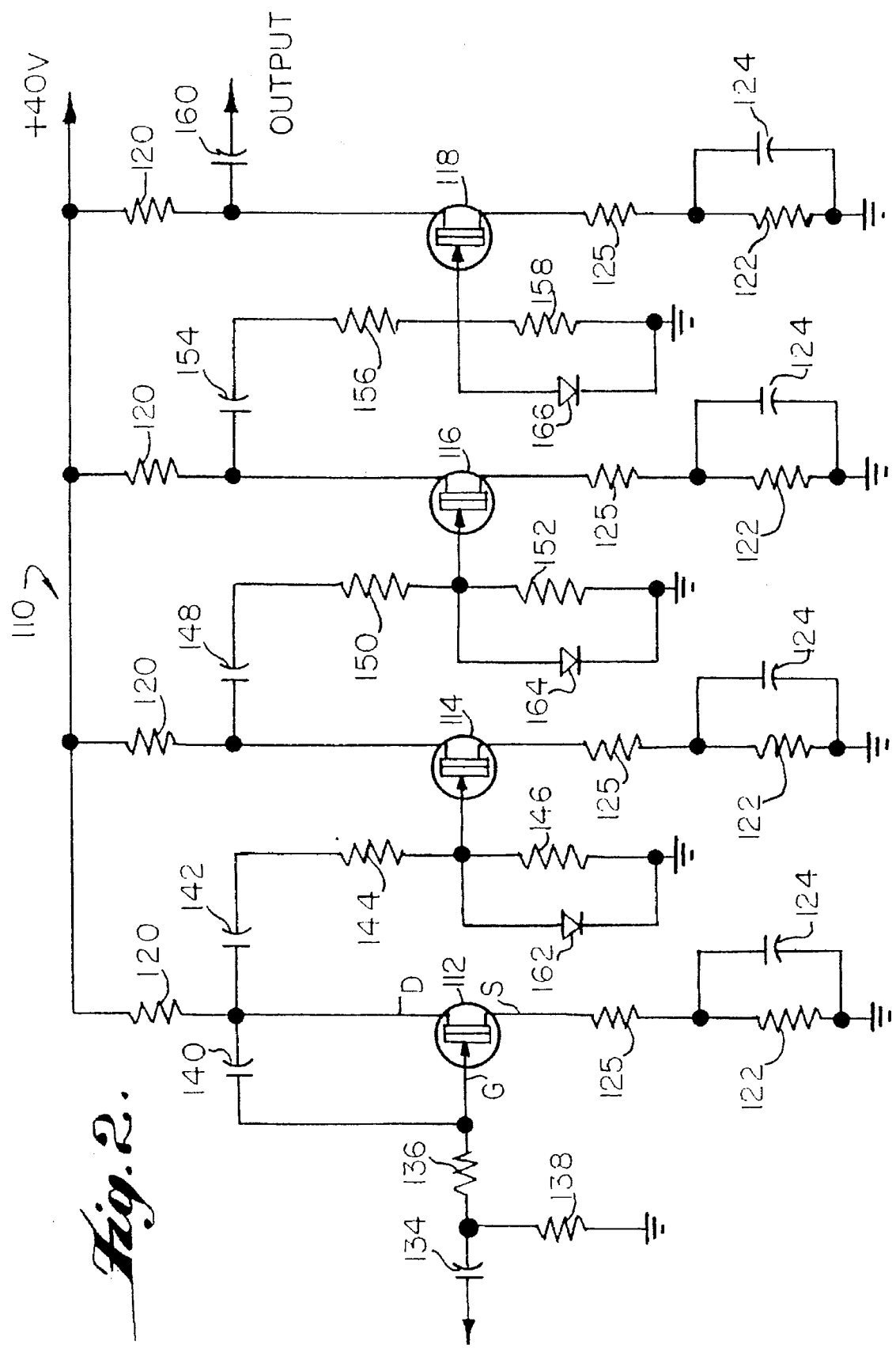
FIG. 2 is a schematic illustration of a multi-stage solid state amplifier according to the invention which emulates the distortion and sound produced by known tube amplifiers.

The present invention as illustrated in FIG. 2, is directed to a solid state multi-stage amplifier 110 which uses components arranged in a manner similar to the known device of FIG. 1. In FIG. 2, the components are numbered with reference numerals which correspond to the reference numerals of FIG. 1 in a 100 series, and the tube sections of the known device have been replaced with four solid state amplifier stages 112, 114, 116 and 118. The devices illustrated are field effect transistors (FET) sometimes referred to as J-FET devices, which are supplied by a 40 volt supply. Each amplifier 112–118 has a source S, a drain D and a gate G terminal as illustrated. The drain D corresponds to the output of the device, and the gate G corresponds to the input of the device. Each stage 112–118 includes a drain resistor 120 similar in value to the plate resistor in FIG. 1 (110 K ohm). In addition, each stage employs a source resistor (33 K ohm) and a bypass capacitor 124 (2.2 uF) in parallel. In addition, each source S has a source resistor 125 (1 K ohm) to set the gain nominally at 100, which is similar to most tube stages. The drain and source resistor values are adjusted so that each FET stage 112, 114, 116 and 118 has a pinch-off voltage of approximately 6 volts with an idle at approximately 180 uA of source current. Each will have approximately +22 volts at the drain D and approximately +6 volts at the source S.

In FIG. 2, the drain D, or output, of stage 112 is coupled to the gate G, or input, of stage 114 by coupling capacitor 142 and gate resistor 144. Resistor 146 provides a ground reference to the gate G of stage 114. Also, resistors 144 and 146 act as a voltage divider. Similarly, as in FIG. 1, the successive stages 116 and 117 are coupled by a corresponding combination of a coupling capacitor, gate resistor and reference resistor 148, 150 and 152 and 154, 156 and 158 respectively. The final stage 118 is coupled to the output by means of coupling capacitor 160. The input stage 112 has a Miller capacitor 140 between drain D and the gate G, as illustrated.

In FIG. 2, without the clipping means, the available peak drain signal output capability or swing in the positive direction for any stage is about 18 volts, i.e., the difference between the drain D and the source S. In each amplifier stage 112–118, the gate G operates as a diode which conducts at a positive peak of about 7 volts. Thus, the ratio of the drain output capability (18 volts) and the gate swing (7 volts) is about 2.57. This ratio is insufficient to cause adequate second harmonic distortion.

In the present invention, clipping means is provided between the stages. In the embodiment disclosed, clipping may be achieved by means of a diode 162, 164 and 166 provided in parallel with the corresponding reference resistor 146, 152 and 158 in each of the respective stages 114, 116 and 118. Each diode 162, 164 and 166 has its cathode coupled to ground and its anode coupled to a node between the divider resistors 144/146, 150/152 and 156/158 of each stage. Each diode 162, 164 and 166 conducts in the forward direction and thereby establishes a clipping level at approximately +0.5 volts change in gate swing to emulate distortion associated with grid conduction in a tube amplifier. The ratio of the drain signal output capability or swing (+18 V) to the gate clipping level (+0.5 V) is 18/0.5=36, which is not as high as a tube circuit. However, in the solid state circuit, the ratio is sufficient to cause adequate second harmonic distortion in each stage. Accordingly, the solid state, multi-stage pre-amplifier 110 of the invention produces distortion performance which is quite similar to that of the tube circuit in FIG. 1 by employing a low level input clipping means, such as diodes 162, 164 and 166.

It should be understood that other solid state devices may be employed other than the J-FET type devices and the diode illustrated. Also, gain, coupling and high-frequency characteristics may be tailored by changing the various element values. However, the clipping means provided between stages is effective to produce the operating second harmonic distortion which causes tube-like sound from a solid state amplifier.

It should be noted that this invention is not just another diode clipping means, and an operating point shift means. Several known systems teach operating point shift by means of a diode, and with such operating point shift, the generation of second harmonic distortion. The present invention shows the important discovery that clipping means such as a simple diode with its forward voltage clipping value of 0.5 volts when driven from a typical solid stage device with an output capability of 30 to 40 volts will very closely match the particular output/input ratio of the existing tube circuits and therefore closely emulate the tube sound. This invention also teaches that there must be multiple stages which generate a multiplicity of levels and amounts of second harmonic distortion over a wide range input signal levels. This is the elusive tube distortion sound; one that can be generated very closely by solid state devices.

Figure 3:
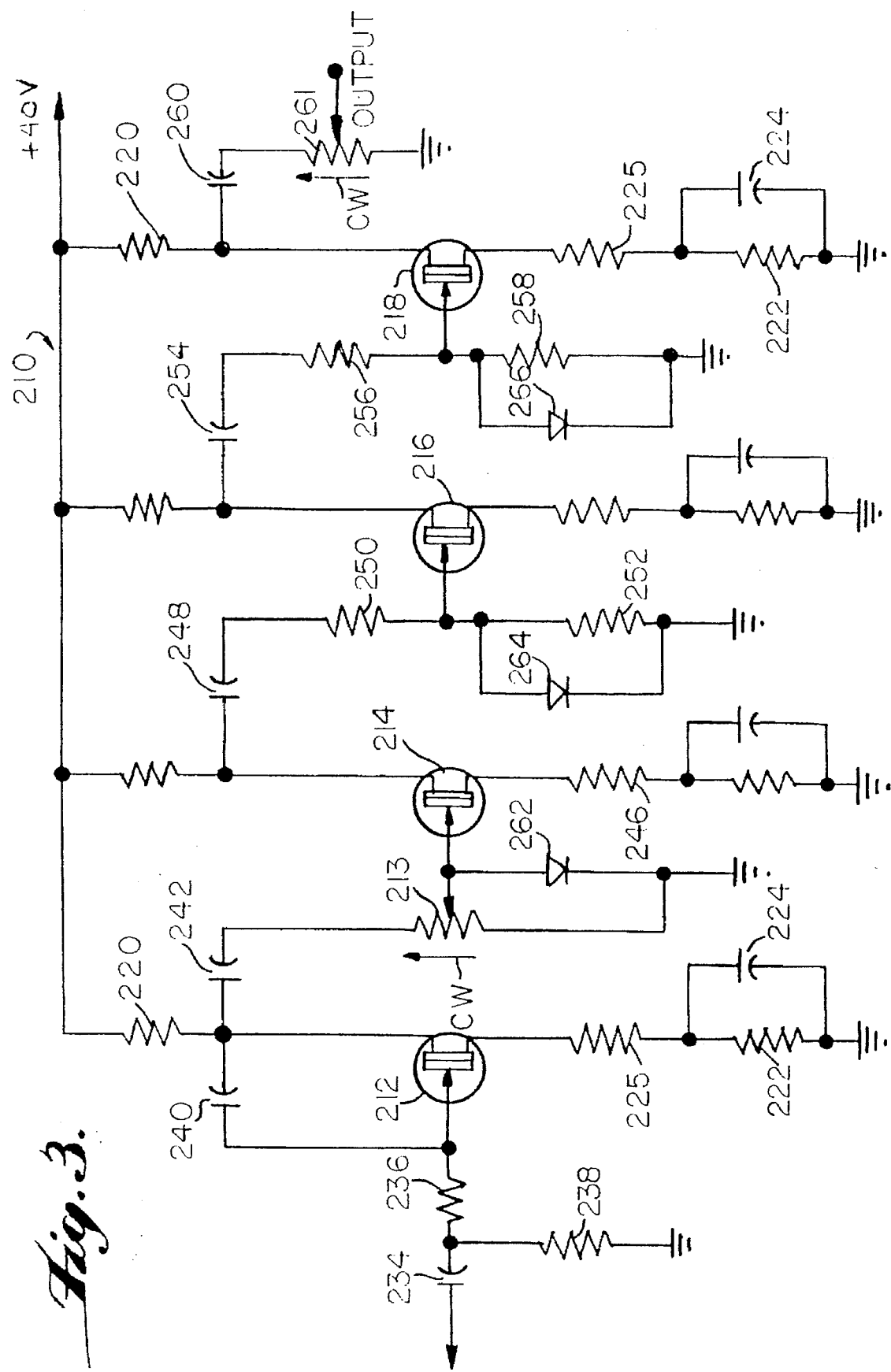
FIG. 3 is a schematic illustration of a particular embodiment of a multi-stage solid stage application according to the invention.

FIG. 3 is an illustration of another embodiment of a multi-stage, solid state 210 amplifier according to the invention. Similar elements have similar reference numbers as shown in FIG. 2 in a 200 series. In FIG. 3, however, a potentiometer 213 is substituted for the fixed divider resistors 144 and 146 between stages 112 and 114. The wiper is coupled to the input of stage 114 and the potentiometer 212 allows maximum distortion in the CW direction where the input resistance to stage 114 is reduced to a minimum.

At the output, a potentiometer 261 is coupled to the coupling capacitor 260. The wiper acts as the output terminal. The output level is maximum when the wiper is in the full CW position. The ability to independently vary the distortion and to vary the level adds versatility to the circuit and allows the artist to tailor the distorted sound at will.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A solid state amplifier for emulating the distortion associated with a flow of current in the grid of an overdriven multi-stage tube amplifier at high input signal levels resulting in an input clipping characteristic comprising:

a plurality of series connected solid state amplifier stages for amplifying a signal each including an input circuit and an output circuit having an output signal capability, each amplifier stage located downstream of a first one of said amplifier stages having its input circuit coupled to the output circuit of one of said amplifier stages located immediately upstream thereof; and clipping means connected in the input circuit of each amplifier stage downstream of the first one of said amplifier stages for establishing a clipping level in one direction between such amplifier stages, duplicating in such solid state amplifier the input clipping characteristic of a tube amplifier wherein the output signal capability and the clipping level are in a ratio similar to tube circuits.

2. The amplifier of claim 1 wherein the amplifier stages devices comprise field effect transistors.

3. The amplifier of claim 1 wherein the clipping means comprises a diode.

4. The amplifier of claim 3 wherein the output signal capability is effective to forward bias the diode.

5. The amplifier of claim 3 wherein the diode produces forward voltage clipping at about 0.5 V.

6. The amplifier of claim 1 wherein the ratio is at least about 30.

7. The amplifier of claim 1 further including variable input means for at least one of said input circuits for varying the distortion.

8. The amplifier of claim 7 wherein the variable input means comprises a potentiometer coupled to the output circuit of a first one of said amplifier stages, said potentiometer having a wiper coupled to the input of a second one of said amplifier stages and the clipping means.

9. The amplifier of claim 1 further comprising variable output means coupled to the output circuit of a last one of said amplifier stages for varying the overall output level of the amplifier.

10. The amplifier of claim 9 wherein the variable output means comprises a potentiometer.

11. The solid state amplifier of claim 1 wherein the output signal capability and the input clipping level between the amplifier stages have a ratio sufficient to result in second harmonic distortion.

12. A solid state amplifier comprising:

a plurality of series connected single ended solid state amplifier stages for amplifying a signal each including an input circuit and an output circuit having an output signal capability, each amplifier stage located downstream of a first one of said amplifier stages and having its input circuit coupled to the output circuit of one of said amplifier stages located immediately upstream thereof;

a clipper connected in the input circuit of each amplifier stage downstream of the first one of said amplifier stages for clipping signals in one direction above a selected level, wherein the output signal capability and the clipping level are in a ratio similar to tube circuits.

13. The solid state amplifier according to claim 12 wherein the output signal capability and the input signal level between amplifier stages have a ratio sufficient to result in second harmonic distortion.

14. A solid state amplifier comprising:

a plurality of series connected solid state amplifier stages each including an input circuit and an output circuit and an output capability, each amplifier stage downstream of a first of said amplifier stages having its input circuit coupled to the output circuit of one amplifier stage connected immediately upstream thereof; and a clipper connected to the input circuit of each amplifier stage downstream of the first one of said amplifier stages for establishing a clipping level therefor; and interstage coupling means for establishing a selected relationship between the output capability of each amplifier stage and the clipping level.

15. A solid state amplifier comprising:

a plurality of series connected field effect transistors (FET) each FET including an input circuit and an output circuit having an output signal capability, each FET located downstream of a first one of said FETs and having its input circuit coupled to the output circuit of an FET connected immediately upstream thereof; and a clipper in the input circuit of each FET downstream of the first one of said amplifier stages.

16. The amplifier according to claim 15 wherein the clipping in the input circuit of each FET establishes a clipping level between the FETs, duplicating in such solid state amplifier the input clipping characteristic of a tube amplifier, and the output signal capability and the input clipping level between the FETs being in a ratio sufficient to result in second harmonic distortion.

* * * * *